(12) United States Patent
Lee et al.

(10) Patent No.: US 7,034,354 B2
(45) Date of Patent: Apr. 25, 2006

(54) SEMICONDUCTOR STRUCTURE WITH LINING LAYER PARTIALLY ETCHED ON SIDEWALL OF THE GATE

(75) Inventors: Yueh-Chuan Lee, Nantou County (TW); Ming-Sheng Tung, Hualian County (TW)

(73) Assignee: Promos Technologies Inc., Hsinchu (TW)

( * ) Notice: Subject to any disclaimer, the term of this patent is extended or adjusted under 35 U.S.C. 154(b) by 0 days.

(21) Appl. No.: 10/695,739

(22) Filed: Oct. 30, 2003

(65) Prior Publication Data

US 2004/0198005 A1    Oct. 7, 2004

(30) Foreign Application Priority Data

Apr. 3, 2003    (TW) .............................. 92107601 A (51) Int. Cl.
*H01L 21/108*    (2006.01)
(52) U.S. Cl. .................. 257/311; 257/312; 257/314; 257/315; 438/257; 438/593
(58) Field of Classification Search ........ 257/311–315, 257/316–317; 438/257–258, 593–595
See application file for complete search history.

(56) References Cited

U.S. PATENT DOCUMENTS

| 6,191,444 B1 * | 2/2001 | Clampitt et al. ............ 257/315 |
| 6,239,011 B1 * | 5/2001 | Chen et al. .................. 438/595 |
| 6,281,076 B1 * | 8/2001 | Choi et al. ................... 438/257 |
| 6,348,709 B1 * | 2/2002 | Graettinger et al. ........ 257/311 |
| 6,660,581 B1 * | 12/2003 | Yang et al. .................. 438/242 |

* cited by examiner

*Primary Examiner*—Dung A. Le
(74) *Attorney, Agent, or Firm*—Birch, Stewart, Kolasch & Birch, LLP (57) ABSTRACT

A semiconductor structure with partially etched gate and method of fabricating the same. A semiconductor structure with a single-sided or dual-sided partially etched gate comprises a gate dielectric layer, a gate conductive layer and a cap layer sequentially stacked on a substrate to form a gate structure, and a lining layer disposed on sidewalls of the gate structure, wherein the lining layer is partially etched to expose the adjacent gate structure. In addition, an inter-layer dielectric layer covers the gate structure and a contact is formed in the inter-layer dielectric layer, exposing the substrate and a portion of the gate structure therein, wherein the lining layer of the exposed portion of the gate structure is partially removed.

15 Claims, 8 Drawing Sheets

SEMICONDUCTOR STRUCTURE WITH LINING LAYER PARTIALLY ETCHED ON SIDEWALL OF THE GATE

This Nonprovisional application claims priority under 35 U.S.C. § 119(a) on Patent Application No(s). 092107601 filed in TAIWAN on Apr. 3, 2003, the entire contents of which are hereby incorporated by reference.

BACKGROUND OF THE INVENTION

1. Field of the Invention

The present invention relates to a semiconductor device and the fabricating method thereof. More particularly, it relates to a semiconductor structure with partially etched gate and method of fabricating the same.

2. Description of the Related Art

In general, the gate structure of a metal oxide semiconductor field effect transistor (MOSFET) device is composed of a metal layer and an oxide layer stacked on a semiconductor substrate. Typically, the metal layer is substituted with a polysilicon layer to act as a gate conductive layer of the gate structure because of poor adhesion between metal and the oxide layer. However, the resistance of polysilicon materials is higher than that of the metal such that the polysilicon layer is usually doped with impurities to lower the resistance thereof. After doping with impurities, the conductivity of the polysilicon layer is reduced but not low enough to act as a conductive layer. A possible solution is to form a metal silicide layer such as tungsten silicide (WSi) layer thereon for improving gate conductivity. In addition, a cap layer is further disposed over the metal silicide layer of the gate structure, and a lining layer and spacers are respectively disposed beside the gate structure to insulate conductive materials thereof. Preferably, the cap layer and the spacer material can be silicon nitride to provide better insulation.

After formation of the gate structure of individual MOSFET device, which acts as a wordline (WL), a thick insulating layer (typically borophosphatesilicate glass (BPSG)) is formed over the wordline. Then an opening is etched through the insulating layer to the substrate between two adjacent wordlines by conventional photolithography and etching. Conductive material is then filled in the opening to form a contact node that connects the follow-up devices such as a bitline. The described process is the so-called "self-aligned contact" (SAC) opening process and is a frequently used semiconductor fabrication procedure.

Nevertheless, during formation of the SAC opening, the spacers are exposed and inevitably removed in part and conductive materials of the gate structure are still protected by the spacers and are not revealed. Once the conductive materials of the gate structure are revealed, an undesirable connection between the gate structure and the bitline contact (CB) can thus occur, referring to a so-called "CB to WL short", and the MOSFET device and the electrical performance thereof cannot be achieved. Conventional semiconductor fabrication often results in over-etched spacers thus revealing the conductive materials of the gate structure causing the so-called "CB to WL short" which results in product loss. In other aspect, another so-called "CB open" can also occur between an insufficiently etched opening of the contact, causing disconnections between the MOSFET device and devices formed in follow-up processes.

Moreover, the aspect ratio between two adjacent gate structures is enlarged, with a shorter distance therebetween due to the increased device integration. Thus, voids in a poorly formed inter-layer dielectric (ILD) layer can cause undesirable shorts between two adjacent contacts such as the bitline contacts during the filling of conductive materials in a subsequent process, so called "CB to CB short", causing device loss and decreased yield.

Thus, a better semiconductor structure for preventing the described undesirable shorts or openings is called for.

SUMMARY OF THE INVENTION

Accordingly, an object of the invention is to provide a semiconductor structure with a partially etched gate to avoid undesirable shorts between bitlines and wordlines or between two adjacent bitlines and bitline openings caused by insufficient etching during formation of device contacts.

Another object of the invention is to provide a fabrication method of a semiconductor structure with partially etched gate that ameliorates the described problems.

Thus, a semiconductor structure with a single-sided partially etched gate in accordance with one embodiment of the invention comprises a gate dielectric layer, a gate conductive layer and a cap layer sequentially stacked on a substrate to form a gate structure, and a lining layer disposed on sidewalls of the gate structure, wherein the lining layer disposed on one sidewall of the gate structure is partially etched to expose the adjacent gate structure. In addition, an inter-layer dielectric layer covers the gate structure and a contact is formed in the inter-layer dielectric layer, exposing the substrate and a portion of the gate structure therein, wherein the lining layer of the exposed portion of the gate structure is partially removed.

Moreover, a method of forming the semiconductor structure with single-sided partially etched gate comprises the steps of providing a semiconductor substrate with at least two adjacent gate structures thereon, wherein each gate structure is composed of a gate dielectric layer, a gate conductive layer, a cap layer, sequentially stacked on the substrate, and a lining layer covered on sidewalls thereof. Then a protective layer and a masking layer are sequentially formed over the gate structures and an opening is formed in the masking layer and the protective layer. The protective layer in the opening is etched to partially expose the lining layer covering one sidewall of the two adjacent gate structures. Next, after the exposed lining layers are removed, the masking layer and the protective layer are then removed. Next, a spacer is formed overlying sidewalls of each gate structure to form a plurality of single-sided partially etched gate structures. In addition, an inter-layer dielectric layer is formed over the gate structures and a bitline contact is formed in the inter-layer dielectric layer to expose the substrate and portions of the adjacent gate structures therein. Moreover, after removal of the exposed lining layers the gate conductive layer adjacent to the exposed lining layer can also be partially removed.

A semiconductor structure with a dual-sided partially etched gate in accordance with another embodiment of the invention comprises a gate dielectric layer, a gate conductive layer and a cap layer, sequentially stacked on a substrate to form a gate structure, and a lining layer disposed on sidewalls of the gate structure, wherein the lining layer disposed on two sidewalls of the gate structure is partially etched to expose the adjacent gate structure. In addition, an inter-layer dielectric layer covers the gate structure and a contact is formed in the inter-layer dielectric layer to expose the substrate and a portion of the gate structure therein, wherein the lining layer of the exposed portion of the gate structure is partially removed.

Moreover, a method of forming the semiconductor structure with dual-sided partially etched gate comprises the steps of providing a semiconductor substrate with at least two adjacent gate structures thereon, wherein each gate structure is composed of a gate dielectric layer, a gate conductive layer, a cap layer, sequentially stacked on the substrate, and a lining layer covered on sidewalls thereof. A protective layer is then formed over the gate structures and portions of the protective layer are etched to partially expose the lining layer covering two sidewalls of the gate structures. After the exposed lining layers and the protective layer are removed, a spacer is formed overlying sidewalls of the gate structures to form a plurality of gate structures with dual-sided partially etched gate conductive layer. In addition, an inter-layer dielectric layer is formed, covering the gate structure, and a bitline contact is formed in the inter-layer dielectric layer to expose the substrate and portions of the gate structures therein, wherein the lining layers of the exposed gate structures are partially removed.

The semiconductor structure with single-sided or dual-sided partially etched gates in accordance with the present invention can prevent the so-called "CB to WL short", "CB open" or "CB to CB short" and pitches between two adjacent gate structures can be enlarged to provide a larger window for the opening formation of the self-aligned contact (SAC) process to meet the demand for line/pitch shrinkage of gate structures.

Moreover, the semiconductor structure with partially etched gates in accordance with the present invention will not affect regions receiving ion implantation such as source/drain implantation and channel length of the partially etched gate structure remains the same and will not be affected by the structure thereof. The method of the present invention can be slightly modified from the in-line processes and quickly and easily applied to the fabrication process.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The method of fabricating a semiconductor structure with partially etched gate in accordance with one embodiment of the invention is shown through FIG. 1 to FIG. 7 and an application thereof in the self-aligned contact (SAC) process is also illustrated.

Figure 1:
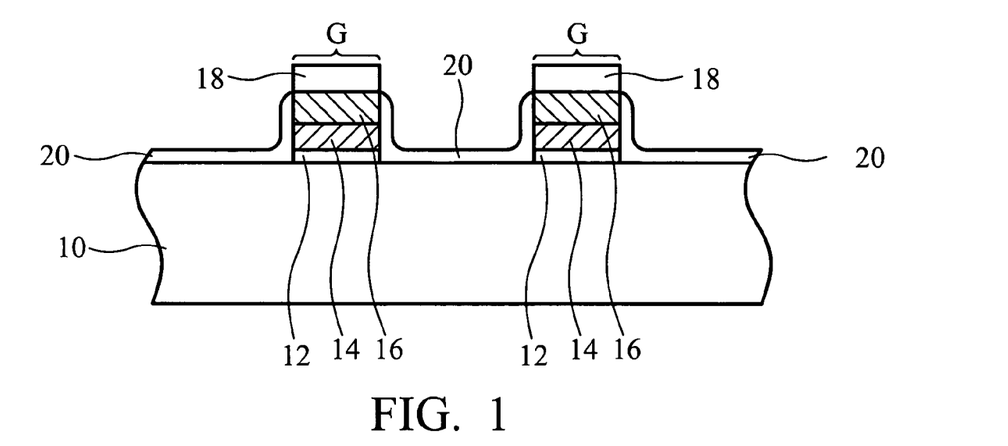
FIGS. 1~7 are cross sections of a fabrication process for forming a SAC opening with a single-sided etched gate structure in accordance with one embodiment of the invention.

In FIG. 1, a semiconductor substrate, for example a silicon substrate 10, with two adjacent gate structures G thereon is provided. Each of the gate structures G includes a gate dielectric layer 12, a polysilicon layer 14, a metal silicide layer 16, and a cap layer 18, sequentially stacked on the silicon substrate 10. A lining layer 20 is formed on the silicon substrate 10, and sidewalls of the gate dielectric layer 12, the polysilicon layer 14 and the metal silicide layer 16. Materials of the gate dielectric layer 12, the polysilicon layer 14, the metal silicide layer 16, the cap layer 18, and the lining layer 20 are preferably silicon dioxide, impurity doped polysilicon, tungsten silicide, silicon nitride and rapid thermal oxide (RTO). The polysilicon layer 14 and the metal silicide layer 16 comprise a gate conductive layer of the gate structures G.

Figure 2:
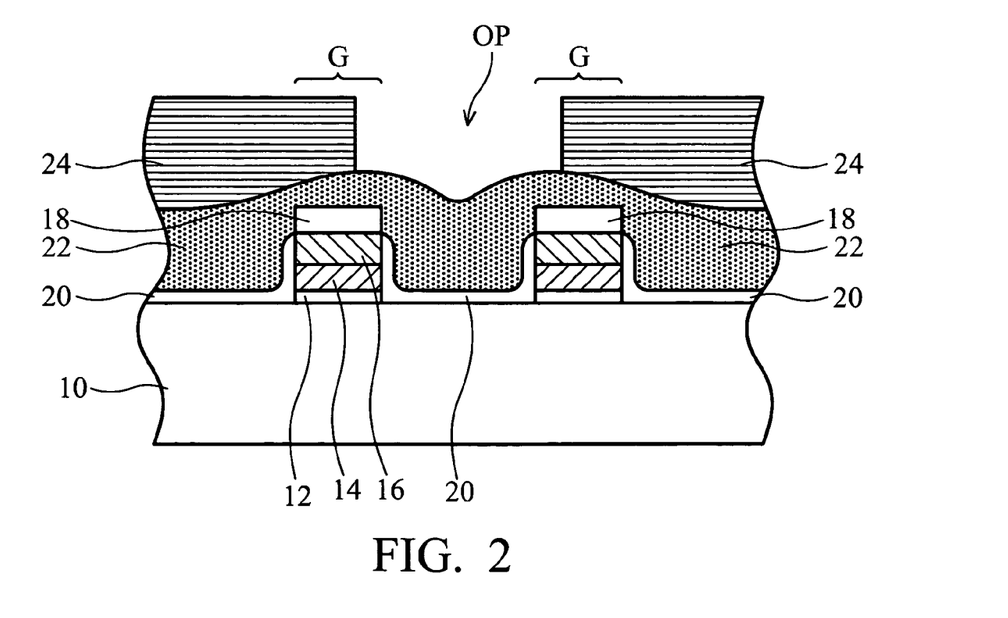

In FIG. 2, a protective layer 22 and a first masking layer 24 are sequentially formed over the gate structures G. The protective layer 22 can be, for example, an anti-reflection coating (ARC) layer and materials of the first masking layer 24 can be, for example, photoresist (PR) materials. Next, photolithography (not shown) is performed to form an opening OP at a proper position in the first masking layer 24 and exposes the protective layer 22 thereunder. Here the position of the opening OP corresponds to a position of a follow-up bitline contact structure such as a bitline contact node or a bitline contact hole and the photolithography for forming the opening OP can be achieved using a bitline contact node reticle or a bit-line contact reticle.

Figure 3:
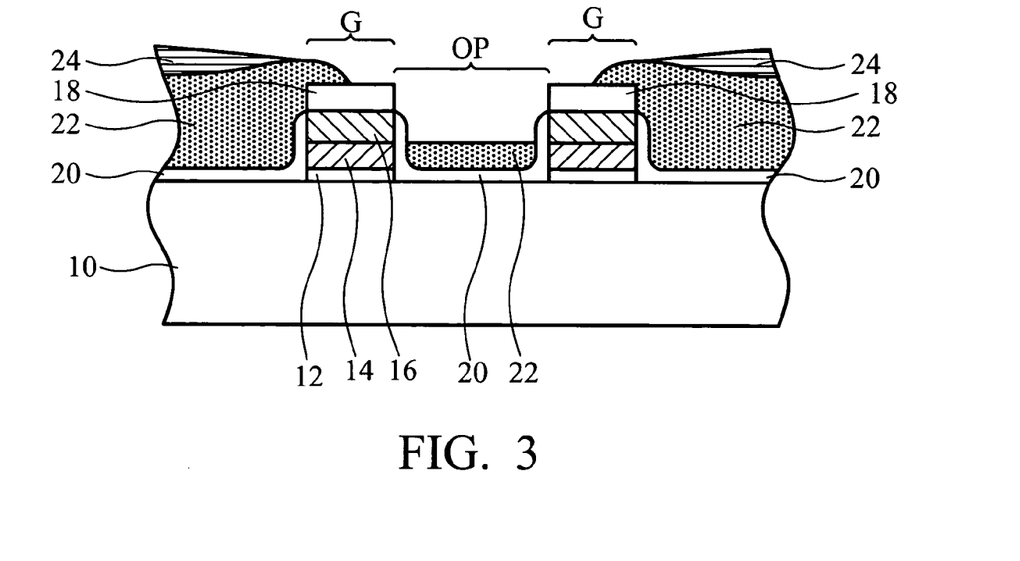

In FIG. 3, the exposed protective layer 22 in the opening OP is then etched to leave portions remained on the lining layer 20 in the opening OP. Thus, the lining layer 20 disposed on one sidewall of each gate structure G is partially exposed.

Figure 4:
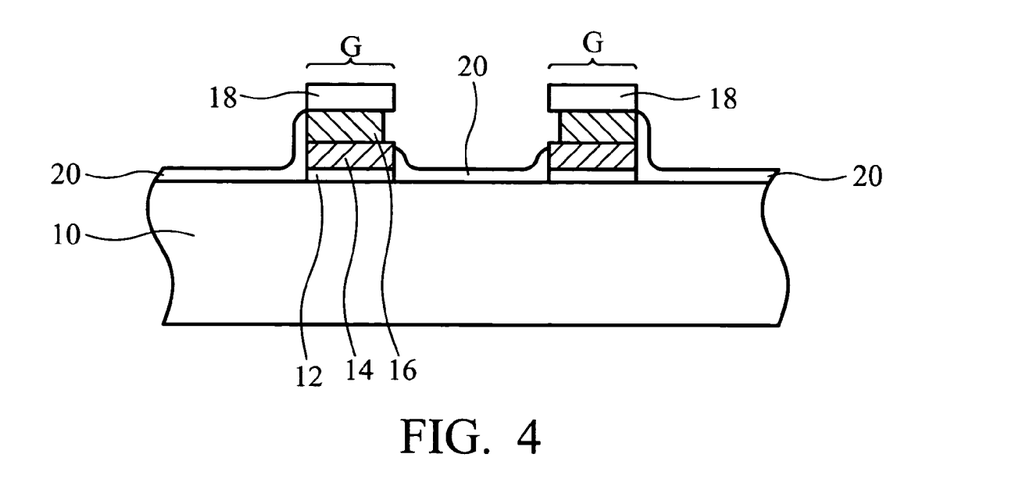

In FIG. 4, an etching step (not shown), for example wet etching using diluted hydrofluoric acid (DHF) or buffer of etching (BOE) etchant containing hydrofluoric acid (HF) and ammonium fluoride ($NH_4F$), is performed to remove portions of the lining layer 20 exposed by the protective layer 22 in the opening OP. Thus, the gate structure G having a single-sided etched lining layer is formed. In addition, another etching step can optionally be proceeded with RCA1 etchant containing ammonium hydroxide ($NH_4OH$) and hydrogen peroxide ($H_2O_2$) to remove portions of the gate conductive layer of the gate structure G, for example the metal silicide layer 16 adjacent to the previously exposed lining layer 20 after the removal thereof. Thus, after removal of the first masking layer 24 and the residue protective layer 22, the gate structure G with single-sided partially etched gate conductive layer is formed.

At this point, those skilled in the art can adjust the height of the remaining protective layer 22 by controlling the described etching of the protective layer 22 within the opening OP to further expose the polysilicon layer 14 of the gate conductive layer after removal of the exposed lining layer 20. Thus, exposure of the gate conductive layer can be adjusted and is not restricted to exposure of the previously formed metal silicide layer 16.

Figure 5:
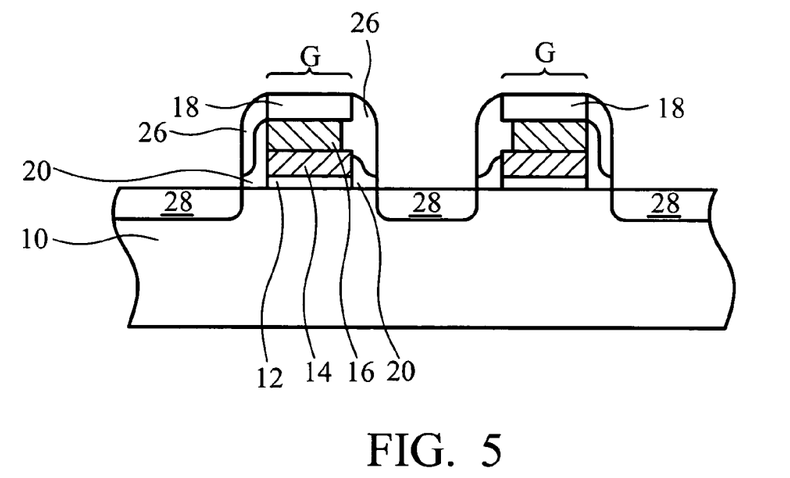

In FIG. 5, a spacer 26 is formed on sidewalls of each gate structure G through conventional deposition and etching-back of insulating materials such as silicon nitride. Each spacer 26 covers the lining layer 20 on sidewalls of the gate structure G and fills in the space created by the previously removed gate conductive layer, such as the metal silicide layer 16. Next, a plurality of doping regions 28 are formed in the silicon substrate 10 on both sides of each gate structure G through the known source/drain ion implantation (not shown) and act as source or drain regions for each gate structure G. Thus, MOSFET devices with single-sided partially etched gate structures G used as a wordline are formed.

Figure 6:
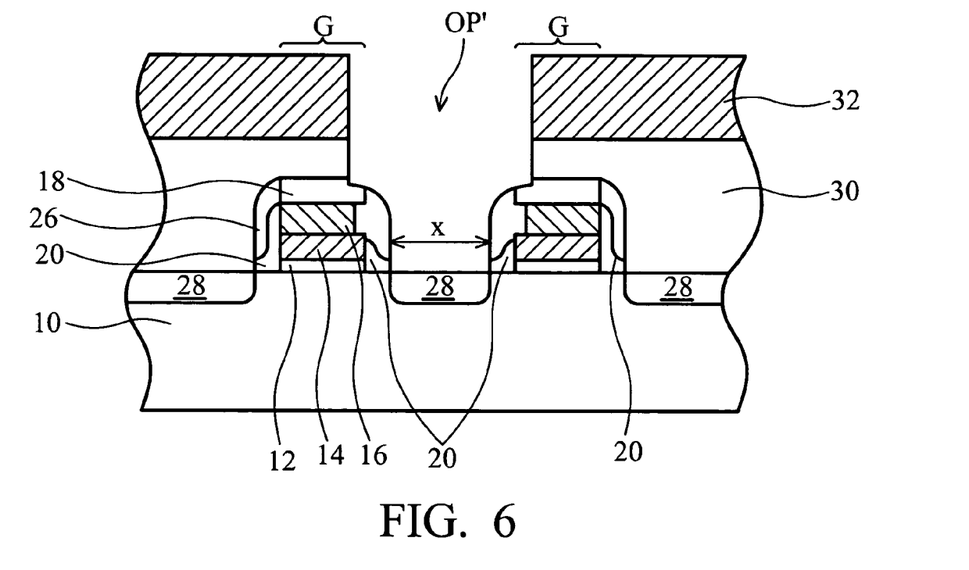

In FIG. 6, a follow-up application of the so-called self-aligned contact (SAC) process relates to the described MOSFET device with single-sided partially etched gate structure G is shown. An inter-layer dielectric (ILD) layer 30, for example a borophosphatesilicate glass (BPSG) layer, and a second masking layer 32, for example a photoresist (PR) layer, are sequentially formed over the substrate 10, covering the MOSFET devices thereon. Next, another opening OP' is formed through the second masking layer 32 and the ILD layer 30 using conventional photolithography and etching (both not shown). During the formation of the opening OP', portions of the cap layer 18 and the spacer 26 are inevitably removed. Since portions of the gate structure G are partially removed in the previous process, the gate conductive layer in the gate structure G can still be insulated by the spacer 26 and the cap layer 18 in the opening OP' and process window thereby extends.

Figure 7:
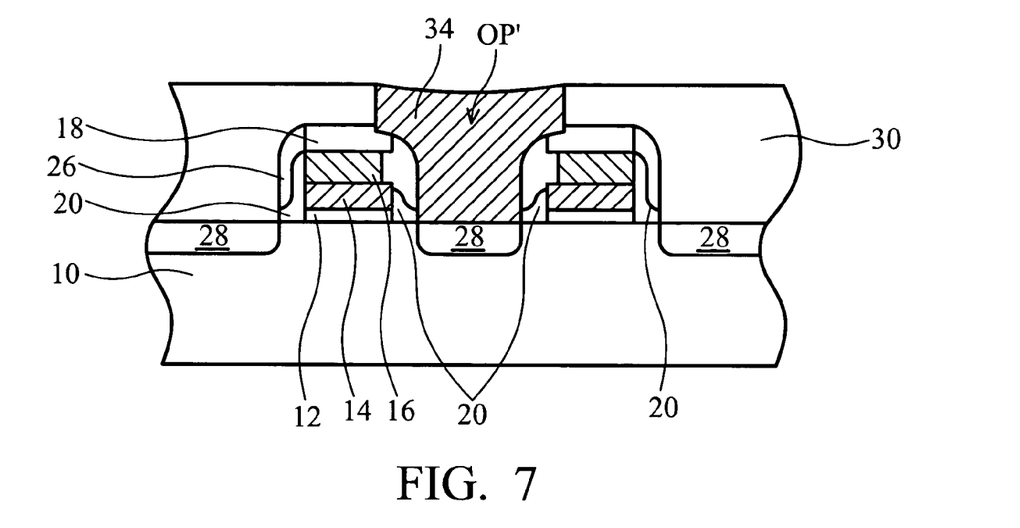

In FIG. 7, after removal of the second masking layer 32, a bitline contact 34 for connections of follow-up devices such as metal lines (not shown) is formed in the opening OP' by depositing and leveling conductive materials. Thus, a so-called self-aligned (SAC) contact is formed.

Moreover, the photolithography step for forming the described opening OP and OP' in first masking layer 24 and second masking layer 32, respectively, is not restricted to conventional photolithography. Nanoimprint lithography (NIL) is also applicable.

Thus, a semiconductor structures with a partially etched gate in accordance with one embodiment of the present invention is respectively illustrated in FIG. 5 and FIG. 7.

In FIG. 5, a semiconductor structure with a single-sided partially etched gate comprises a semiconductor substrate (referring to the silicon substrate 10) with a gate structures G formed thereon, wherein the gate structure G is composed of a gate dielectric layer 12, a gate conductive layer (referring to the composite layer of the polysilicon layer 14 and the metal silicide layer 16) and a cap layer 18 stacked on the substrate. A lining layer 20 is disposed on sidewalls of the gate structure G, wherein the lining layer 20 disposed on one sidewall of the gate structure G is partially etched to expose the adjacent gate structure G. Optionally, the exposed gate structure, such as a metal silicide layer 16, can also be partially etched. In addition, a spacer 26 covers sidewalls of the gate structure G and the lining layer 20.

Thus in FIG. 7, a semiconductor structure with partially etched gate shown in FIG. 5 is provided with a follow-up application further comprises an inter-layer dielectric layer 30 covering the gate structure G. A contact (referring to the bitline contact 34) is formed in the inter-layer dielectric layer 30, exposing the substrate 10 and a portion of the gate structures G therein, wherein the lining layer 20 of the exposed portion of the gate structure G is partially removed.

A method of fabricating a semiconductor structure with a partially etched gate in accordance with another embodiment of the invention is shown in FIG. 8 through FIG. 16 and an application thereof in the self-aligned contact (SAC) process is also illustrated.

Figure 8:
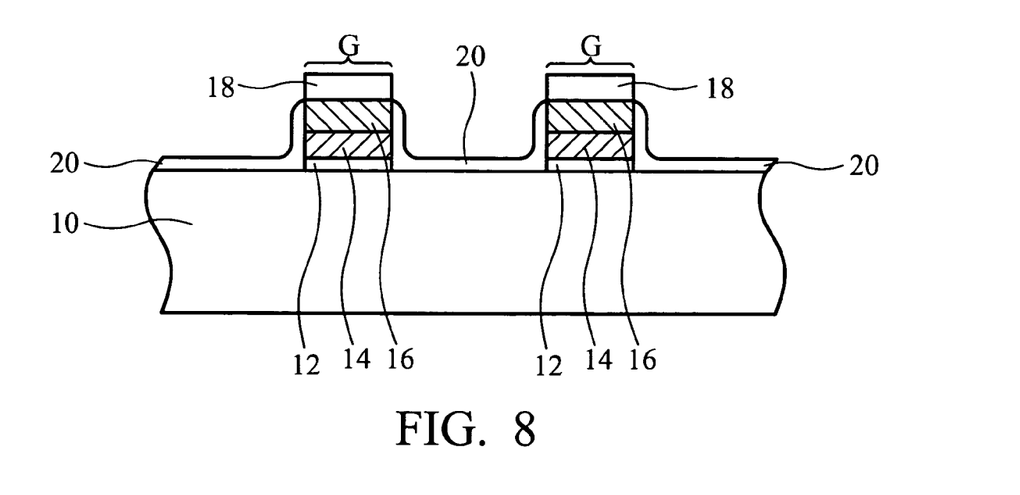
FIGS. 8~16 are cross sections of a fabrication process for forming a SAC opening with a dual-sided etched gate structure in accordance with another embodiment of the invention.

In FIG. 8, a semiconductor substrate, for example a silicon substrate 10, with two adjacent gate structures G thereon is provided. Each of the gate structures G comprises a gate dielectric layer 12, a polysilicon layer 14, a metal silicide layer 16, and a cap layer 18, sequentially stacked on the silicon substrate 10. A lining layer 20 is formed on the silicon substrate 10, and sidewalls of the polysilicon layer 14 and the metal silicide layer 16. Materials of the gate dielectric layer 12, the polysilicon layer 14, the metal silicide layer 16, the cap layer 18 and the lining layer 20 are preferably silicon dioxide, impurity doped polysilicon, tungsten silicide, silicon nitride, and rapid thermal oxide (RTO). The polysilicon layer 14 and the metal silicide layer 16 comprise a gate conductive layer of the gate structures G.

Figure 9:
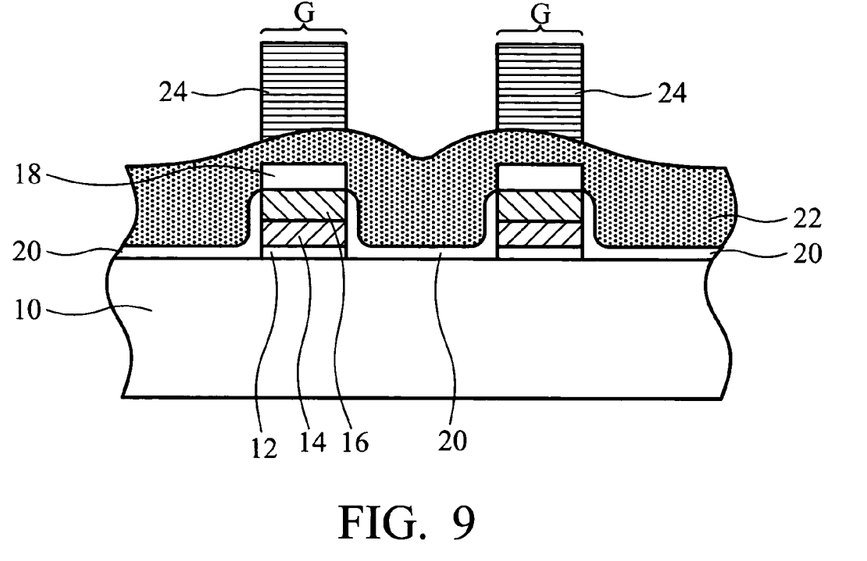

In FIG. 9, a protective layer 22 and a first masking layer are sequentially formed over the gate structures G. The protective layer 22 can be, for example, an anti-reflection coating (ARC) layer and materials of the first masking layer can be, for example, photoresist (PR) materials. Next, photolithography (not shown) is performed to pattern the first masking layer and leaves first masking patterns 24 respectively disposed on the position relative to each gate structure G therebelow.

Figure 10:
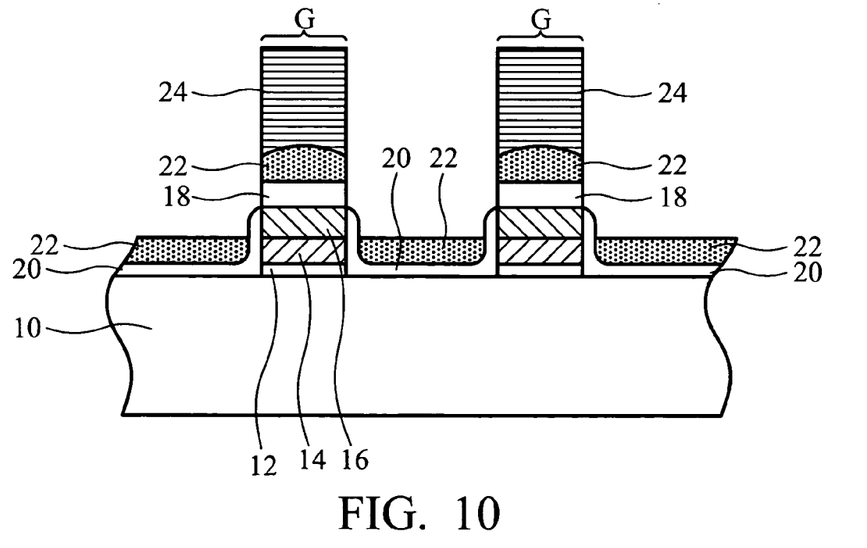

In FIG. 10, the protective layer 22 exposed by the first masking patterns 24 is then etched to leave portions remained on the lining layer 20. Thus, the lining layer 20 disposed on both sidewalls of each gate structure G is partially exposed.

Figure 11:
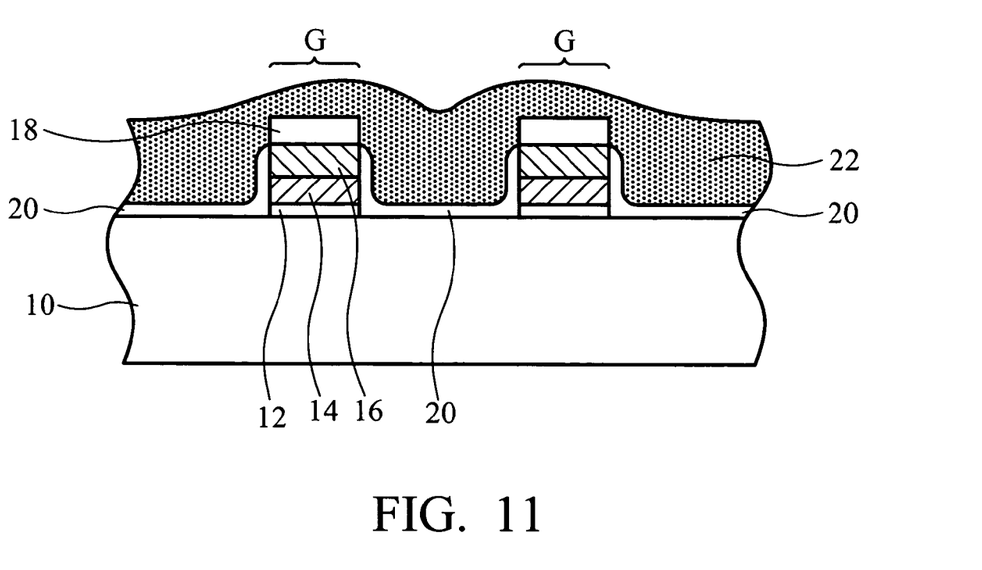
Figure 12:
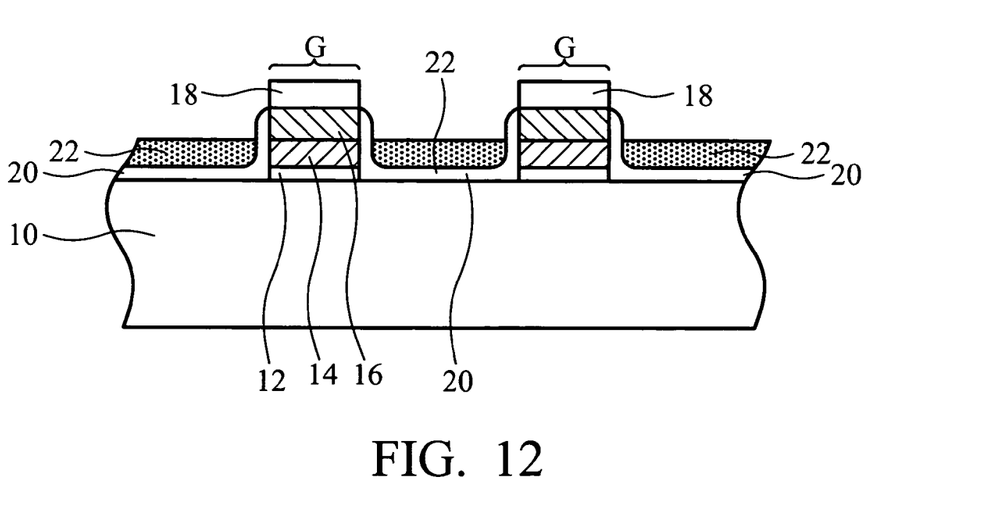

Moreover, the processes shown in FIG. 9 and FIG. 10 can be optionally substituted by the processes shown in FIG. 11 and FIG. 12. In FIG. 11, a protective layer 22 is formed over these gate structure G. The protective layer 22 can be, for example, an anti-reflection coating (ARC) layer or a photoresist (PR) layer.

In FIG. 12, an etching-back process (not shown) is performed to etch the protective layer 22 to leave portions remained on the lining layer 20. Thus, the lining layer 20 disposed on both sidewalls of each gate structure G is partially exposed.

Figure 13:
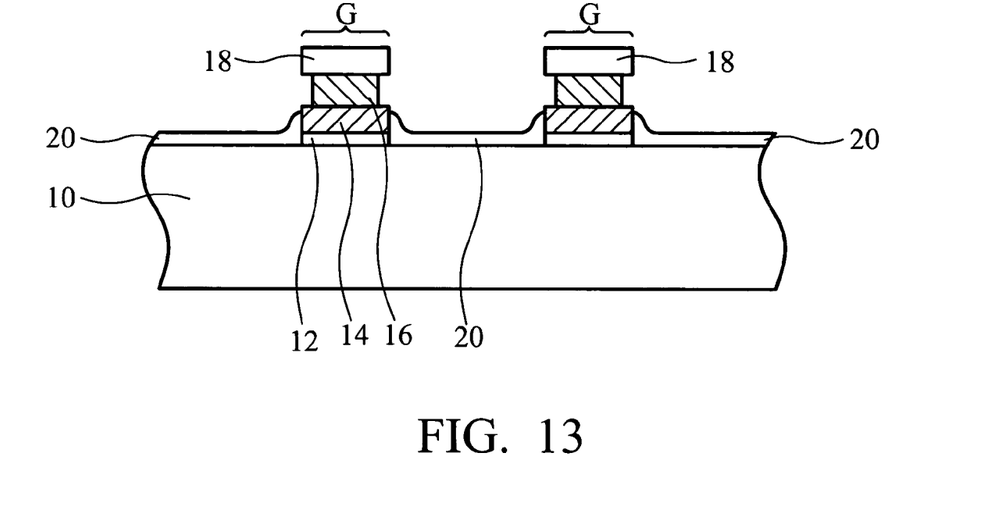

In FIG. 13, an etching step (not shown), for example wet etching using diluted hydrofluoric acid (DHF) of buffer etching (BOE) etchant containing hydrofluoric acid (HF) and ammonium fluoride ($NH_4F$), is performed to remove portions of the lining layer 20 exposed by the protective layer 22. Thus, the gate structure G having a dual-sided etched lining layer is formed. In addition, another etching step can optionally be proceeded with RCA1 etchant containing ammonium hydroxide ($NH_4OH$) and hydrogen peroxide ($H_2O_2$) to remove portions of the gate conductive layer of the gate structure G, for example the metal silicide layer 16 adjacent to the previously exposed lining layer 20 after the removal thereof. Thus, after removal of the first masking layer 24 and/or the residue protective layer 22, the gate structure G with dual-sided partially etched gate conductive layer is formed.

At this point, those skilled in the art can adjust height of the remaining protective layer 22 by controlling the described etching of the protective layer 22 within the opening OP to further expose the polysilicon layer 14 of the gate conductive layer after the removal of the exposed lining layer 20. Thus, exposure of the gate conductive layer can be adjusted and is not restricted to exposure of the previously formed metal silicide layer 16.

Figure 14:
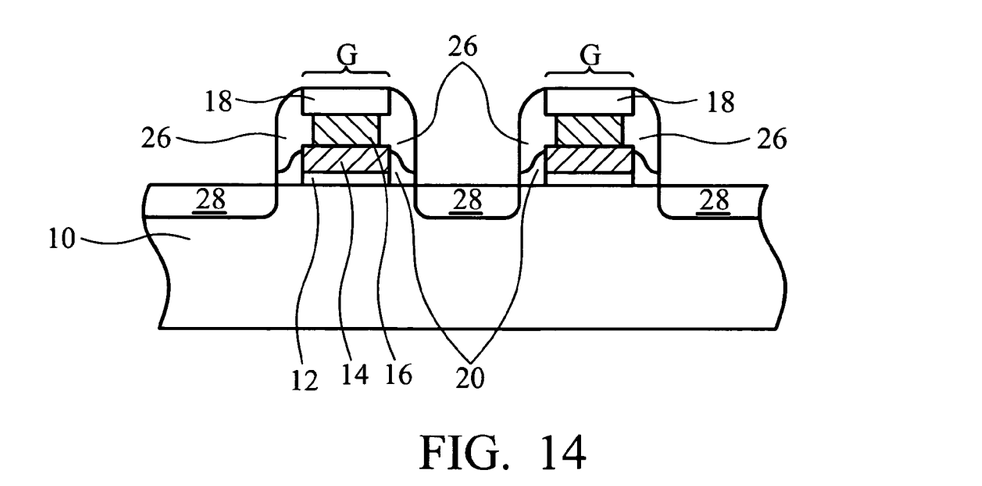

In FIG. 14, a spacer 26 is formed on sidewalls of each gate structure G through conventional deposition and etching-back of insulating materials such as silicon nitride. Each spacer 26 covers the lining layer 20 on sidewalls of the gate structure G and fills in space created by the previously removed gate conductive layer such as the metal silicide layer 16. Next, a plurality of doping regions 28 are formed in the silicon substrate 10 on both sides of each gate structure G through the known source/drain ion implantation (not shown) and act as source or drain regions for each gate structure G. Thus, MOSFET devices with dual-sided partially etched gate structure G used as a wordline are formed.

Figure 15:
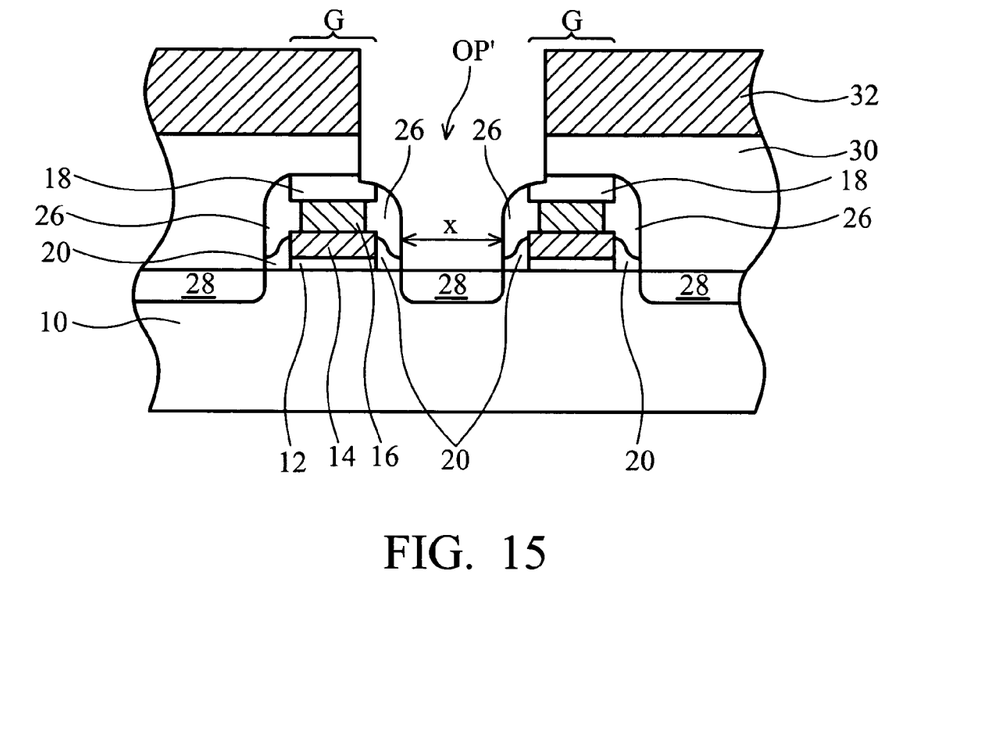

In FIG. 15, a follow-up application of the so-called self-aligned contact (SAC) process relating to the described MOSFET device with dual-sided partially etched gate structure G is shown. An inter-layer dielectric (ILD) layer 30, for example borophosphatesilicate glass (BPSG) layer, and a second masking layer 32, for example photoresist (PR)

layer, are sequentially formed over the substrate 10, covering the MOSFET devices thereon. Next, an opening OP' is formed through the second masking layer 32 and the ILD layer 30 using conventional photolithography and etching (both not shown). During the formation of the opening OP', portions of the cap layer 18 and the spacer 26 are inevitably removed. Since portions of the gate structure G are partially removed in the previous process, the gate conductive layer in the gate structure G can still be insulated by the spacer 26 and the cap layer 18 in the opening OP' and process window thereby extends.

Figure 16:
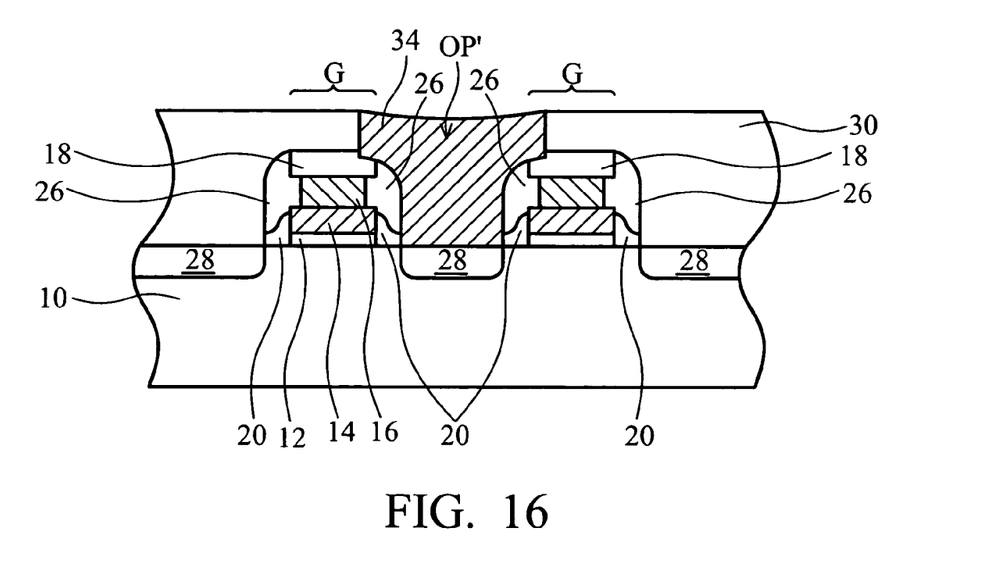

In FIG. 16, after removal of the second masking layer 32, a bitline contact 34 for connections of follow-up devices such as metal lines (not shown) is formed in the opening OP' by depositing and leveling of conductive materials. Thus, a so-called self-aligned (SAC) contact is formed.

Moreover, the photolithography for forming the described opening OP' in second masking layer 32 is not restricted to the conventional photolithography. Nanoimprint lithography (NIL) can also be applied.

Thus, a semiconductor structure with a partially etched gate in accordance with another embodiment of the present invention can be respectively illustrated in FIG. 14 and FIG. 16.

In FIG. 14, a semiconductor structure with a dual-sided partially etched gate comprises a semiconductor substrate (referring to the silicon substrate 10) with a gate structures G formed thereon, wherein the gate structure G is composed of a gate dielectric layer 12, a gate conductive layer (referring to the composite layer of the polysilicon layer 14 and the metal silicide layer 16) and a cap layer 18 stacked on the substrate. A lining layer 20 is disposed on sidewalls of the gate structure G, wherein the lining layer 20 disposed on both sidewalls of the gate structure G is partially etched to expose the adjacent gate structure G. Optionally, the exposed gate structure, such as a metal silicide layer 16, can also be partially etched. In addition, a spacer 26 covers sidewalls of the gate structure G and the lining layer 20.

Thus in FIG. 16, a semiconductor structure with a partially etched gate shown in FIG. 14 is provided in a follow-up application further comprising an inter-layer dielectric layer 30 covering the gate structure G. A contact (referring to the bitline contact 34) is formed in the inter-layer dielectric layer 30, exposing the substrate 10 and a portion of the gate structures G therein, wherein the lining layer 20 and the exposed portion of the gate structure G is partially removed.

The semiconductor structure with single-sided or dual-sided partially etched gates is shown in FIG. 6 and FIG. 15 respectively. During formation of the openings OP' of the self-aligned contact (SAC) process, the conductive portions within the partially etched gate structure G can still be protected by the adjacent spacers 26 and will not be revealed. Thus, shorts between the bitline contacts (referring to the bitline contact 34) and the wordlines (referring to the gate structures G) can be avoided.

In addition, removal of portions of the gate conductive layer in a gate structure can be controlled by the described fabricating methods of the present invention to maintain the sheet resistance of a gate. Moreover, removal of the lining layer adjacent to materials of the gate conductive layer such as a metal silicide layer therein can enlarge the pitch (referring to the distance X shown in FIG. 6 and FIG. 15) between two adjacent gate structures G against the trend of line/pitch shrinking of gate structures. Thus, a larger window for the SAC process can be provided and the so-called "CB open" or "CB to CB short" caused by connections of two bitlines through a poorly formed ILD layer can be prevented. Channel length of the gate structure with partially etched gate can remain the same and will not be affected by the partially etched structure thereof.

Applications of the SAC process based on the gate structure with a single or dual-sided partially etched gate conductive layer avoids the conventional problems such as CB to WL short, CB open, or CB to CB short. The fabrication method can be slightly modified from in-line processes and can be easily and quickly adapted to the fabrication process.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure with a partially etched gate, comprising:

a semiconductor substrate;

a gate dielectric layer, a gate conductive layer and a cap layer, sequentially stacked on the substrate to form a gate structure;

a lining layer disposed on sidewalls of the gate structure, wherein the lining layer disposed on one sidewall of the gate structure is partially etched to expose the adjacent gate structure;

an inter-layer dielectric layer covering the gate structure; and a contact formed in the inter-layer dielectric layer, exposing the substrate and a portion of the cap layer of the gate structure therein, wherein the lining layer of the exposed portion of the gate structure is partially removed.

2. The semiconductor structure as claimed in claim 1, wherein the exposed gate structure is the gate conductive layer.

3. The semiconductor structure as claimed in claim 2, wherein the gate conductive layer comprises a polysilicon layer and a metal silicide layer.

4. The semiconductor structure as claimed in claim 3, wherein the exposed gate structure is the metal silicide layer and portions thereof are partially etched.

5. The semiconductor structure as claimed in claim 1, further comprising a spacer disposed on sidewalls of each gate structure, covering the lining layer.

6. The semiconductor structure as claimed in claim 5, wherein material of the spacer is silicon nitride.

7. The semiconductor structure as claimed in claim 1, wherein the lining layer is a rapid thermal oxide (RTO) layer.

8. A semiconductor structure with a partially etched gate, comprising:

a semiconductor substrate;

a gate dielectric layer, a gate conductive layer and a cap layer, sequentially stacked on the substrate to form a gate structure; and a lining layer disposed on sidewalls of the gate structure, wherein the lining layer disposed on two sidewalls of the gate structure is partially etched to expose the adjacent gate structure.

9. The semiconductor structure as claimed in claim 8, further comprising:

an inter-layer dielectric layer covering the gate structure; and a contact formed in the inter-layer dielectric layer, exposing the substrate and a portion of the gate structure therein, wherein the lining layer of the exposed portion of the gate structure is partially removed.

10. The semiconductor structure as claimed in claim 8, wherein the exposed gate structure is the gate conductive layer.

11. The semiconductor structure as claimed in claim 10, wherein the gate conductive layer comprises a polysilicon layer and a silicide layer.

12. The semiconductor structure as claimed in claim 11, wherein the exposed gate structure is the metal silicide layer with partially etched portions.

13. The semiconductor structure as claimed in claim 8, further comprising a spacer disposed on sidewalls of the gate structure, covering the lining layer.

14. The semiconductor structure as claimed in claim 13, wherein material of the spacer is silicon nitride.

15. The semiconductor structure as claimed in claim 8, wherein the lining layer is a rapid thermal oxide (RTO) layer.

* * * * *